(12) United States Patent
Lee

(10) Patent No.: US 7,679,919 B2
(45) Date of Patent: Mar. 16, 2010

(54) HEAT SINK AND ELECTRONIC APPARATUS USING THE SAME

(75) Inventor: Chia-Ming Lee, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 0 days.

(21) Appl. No.: 12/216,017

(22) Filed: Jun. 27, 2008

(65) Prior Publication Data
US 2009/0147480 A1 Jun. 11, 2009

(30) Foreign Application Priority Data
Dec. 5, 2007 (TW) ............................ 96146409 A

(51) Int. Cl.
H05K 7/20 (2006.01)
F28F 7/00 (2006.01)
H01L 23/34 (2006.01)

(52) U.S. Cl. ...................... 361/719; 165/80.2; 165/185; 257/719; 361/704

(58) Field of Classification Search ................. 257/719; 361/719
See application file for complete search history.

(56) References Cited

U.S. PATENT DOCUMENTS

| | | | | |
|---|---|---|---|---|
| 5,662,163 A * | 9/1997 | Mira | ......................... | 165/80.3 |
| 5,784,257 A * | 7/1998 | Tata | ........................... | 361/704 |
| 5,932,925 A * | 8/1999 | McIntyre | ..................... | 257/719 |
| 6,058,014 A * | 5/2000 | Choudhury et al. | ......... | 361/704 |
| 6,282,093 B1 * | 8/2001 | Goodwin | ..................... | 361/704 |
| 6,462,951 B2 * | 10/2002 | Letourneau | .................. | 361/704 |
| 6,865,082 B2 | 3/2005 | Huang et al. | | |
| 7,009,843 B2 * | 3/2006 | Lee et al. | ..................... | 361/704 |
| 7,327,573 B2 * | 2/2008 | Lee et al. | ..................... | 361/704 |
| 7,375,963 B2 * | 5/2008 | Eckberg et al. | ............. | 361/704 |
| 7,508,667 B2 * | 3/2009 | Wu et al. | ..................... | 361/697 |
| 2004/0012927 A1 * | 1/2004 | Lee et al. | ..................... | 361/719 |
| 2007/0263363 A1 * | 11/2007 | Liu et al. | ..................... | 361/719 |

* cited by examiner

*Primary Examiner*—Gregory D Thompson
(74) *Attorney, Agent, or Firm*—Bacon & Thomas PLLC

(57) ABSTRACT

A heat sink and an electronic apparatus using the same are disclosed. The heat sink comprises a fin structure and a fastening assembly; the fastening assembly comprises an adjustable positioning member, an elastic member, and a hooking member, the elastic member being disposed between the hooking member and the fin structure such that the adjustable positioning member combines the hooking member, the elastic member, and the fin structure; wherein the hooking member may secure the heat sink onto an electronic component, and the adjustable positioning member may be used to adjust the tightness between the heat sink and the electronic component.

16 Claims, 5 Drawing Sheets

US 7,679,919 B2

HEAT SINK AND ELECTRONIC APPARATUS USING THE SAME

BACKGROUND OF THE INVENTION

1. Field of the Invention

The present invention relates to a heat sink; more particularly, this invention provides a heat sink which may be loosened or tightened to adjust its connection to an electronic component, and an electronic apparatus containing the heat sink. Via adjustment of that connection, the pressure on the electronic component may be evenly spread.

2. Description of the Related Art

With advances in technology, the processing speed and capabilities of an electronic component (e.g. the central processing unit of a computer) responsible for processing data have largely also increased. Meanwhile, a large amount of heat is generated during the operation of the electronic component. So far, several heat sinks have been developed to facilitate the heat dissipation of the electronic component. Most known heat sinks need a locking member to lock them onto the electronic component with or without a screw so as to secure the heat sink and perform heat dissipation. However, when a user is installing a heat sink which uses a locking member, he or she will almost inevitably need an auxiliary tool such as a screwdriver to lock the heat sink into place, which largely increases the complexity of the installation; in addition, many screws are usually needed to secure the heat sink, so the time required to perform the installation of the heat sink is increased. Furthermore, if the electronic component is acted upon by a overly large force or unequal pressure during the installation, the electronic component or the soldering point thereof may be broken, adding to the risk of the installation.

SUMMARY OF THE INVENTION

It is therefore an object of the present invention to provide a heat sink which may be adjusted to equalize the pressure on an electronic component.

It is another object of the present invention to provide an electronic apparatus containing the heat sink mentioned above.

One object is readily obtained according to the present invention in a heat sink comprising a fin structure and a fastening assembly; the fastening assembly comprises an adjustable positioning member, a flexible member, and a hooking member, the flexible member being disposed between the hooking member and the fin structure so that the adjustable positioning member combines the hooking member, the flexible member and the fin structure; wherein the hooking member may secure the heat sink on an electronic component, and the adjustable positioning member may be used to adjust the tightness between the heat sink and the electronic component. With the design mentioned above, users may predefine the pressure which the heat sink imposes on the electronic component and evenly spread the pressure on the electronic component without causing any damage.

Similarly, to materialize the other object, the electronic apparatus with a heat sink comprises a housing, a circuit board, and at least one aforementioned heat sink. The circuit board is disposed in the housing and comprises at least one electronic component; the heat sink is mounted on the electronic component to dissipate heat. With this design, the electronic apparatus is capable of efficiently dispelling the heat generated by the electronic component via the heat sink without damage to the electronic component being caused; furthermore, the time required to install the heat sink may be largely reduced.

Other objects, advantages, and novel features of the invention will become more apparent from the following detailed description when taken in conjunction with the accompanying drawings.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

Figure 1:
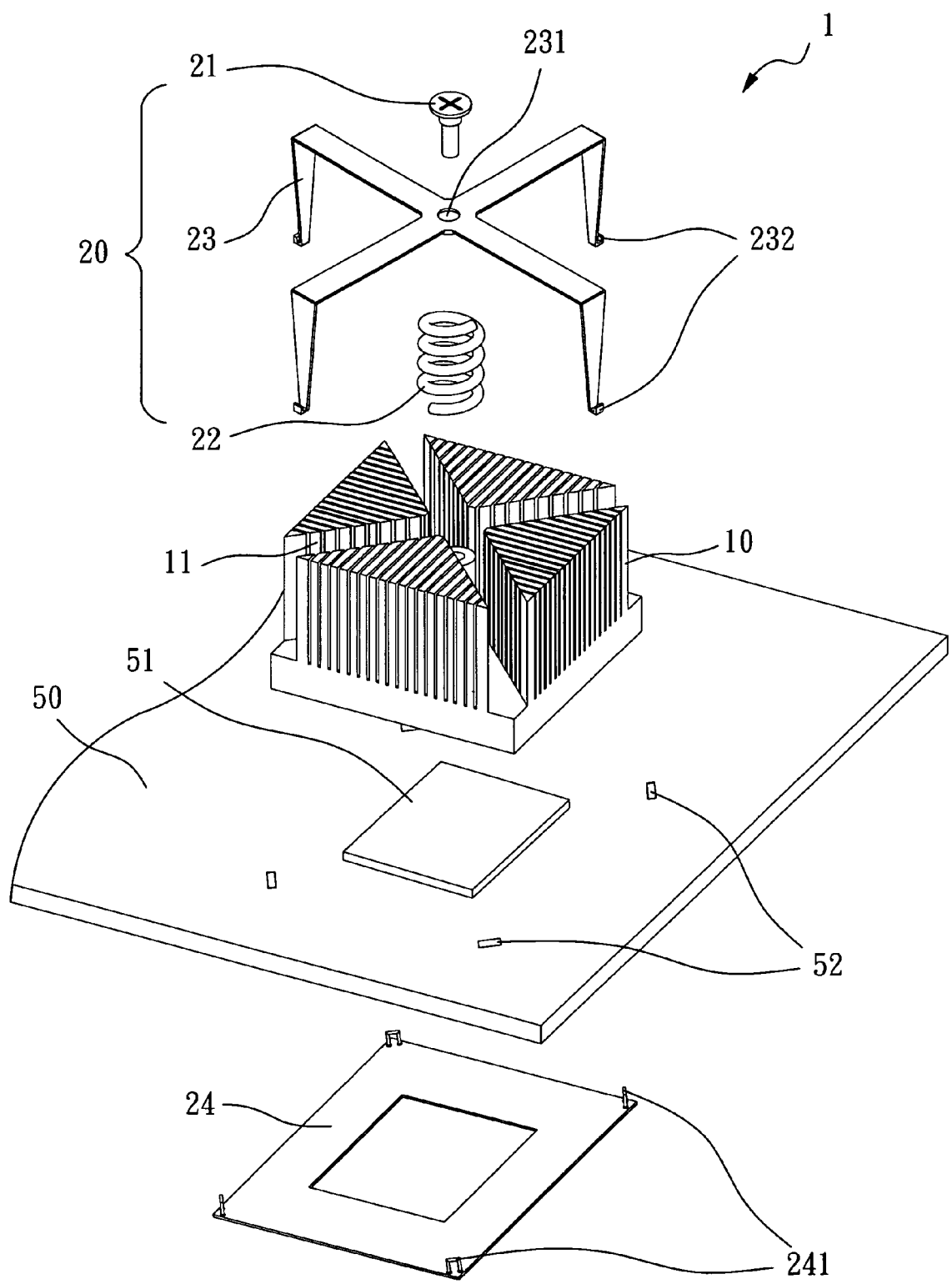
FIG. 1 is an explosive view of the heat sink of the present invention.

Refer to FIG. 1 for an explosive view of the heat sink of the present invention. As shown, the heat sink 1 of this invention may be mounted on an electronic apparatus (not shown) which comprises a circuit board 50 having an electronic component 51. The heat sink 1 of this invention comprises a fin structure 10 and a fastening assembly 20 which comprises an adjustable positioning member 21, an elastic member 22, and a hooking member 23. The elastic member 22 is disposed between the hooking member 23 and the fin structure 10 so that the adjustable positioning member 21 combines the hooking member 23, the elastic member 22, and the fin structure 10. The hooking member 23 may secure the heat sink 10 on the electronic component 51, and the adjustable positioning member 21 may be used to adjust the tightness between the heat sink 1 and the electronic component 51. In this embodiment, the adjustable positioning member 21 is a captive screw, which has the function of fastening and adjusting. The adjustable positioning member 21, without any limitation, may also be replaced by other parts such as a quick-release structure. With the aforementioned design, manufacturers may predefine the pressure imposed on the electronic component 51 by the heat sink 1 via the adjustable positioning member 21 and the elastic member 22 so that the pressure is evenly spread on the electronic component 51. Moreover, users may redefine the pressure to meet their needs and obtain desirable heat dissipation efficiency.

The fastening assembly 20 of the heat sink 1 may further comprise a fixing and supporting module 24 mountable on the circuit board 50. The fixing and supporting module 24 comprises a plurality of hooking and fixing bases 241. The fixing and supporting module 24 is disposed under the circuit board 50, and a plurality of via holes 52 corresponding to the hooking and fixing bases 241 may be formed on the circuit board 50. In this way, when the fixing and supporting module 24 and the circuit board 50 are assembled, the hooking and fixing bases 241 may penetrate the circuit board 50 through the via holes 52.

The fin structure 10 of the heat sink 1 of this invention has a groove 11 for accommodating the hooking member 23 so that the hooking member 23 may be disposed into the groove 11 during the installation of the heat sink 1. The hooking member 23 comprises an aperture 231 by which the hooking member 23 may secure the adjustable positioning member 21 and allow part of the adjustable positioning member 21 to pass through the aperture 231. The hooking member 23 further comprises a plurality of hooking structures 232 corresponding to the hooking and fixing bases 241. In this embodiment, the hooking member 23 is a cross-shaped hook for dispersing the pressure on the electronic component 51 during the installation of the heat sink 1; however, the hooking member 23 may not limited to a Y-shaped hook or other member for fastening. It should be noted that the shape of the groove 11 of the fin structure 10 and the number and position of the hooking and fixing bases 241 may be varied when the hooking member 23 is changed. The design of this embodiment shall not be deemed as a restriction.

Figure 2:
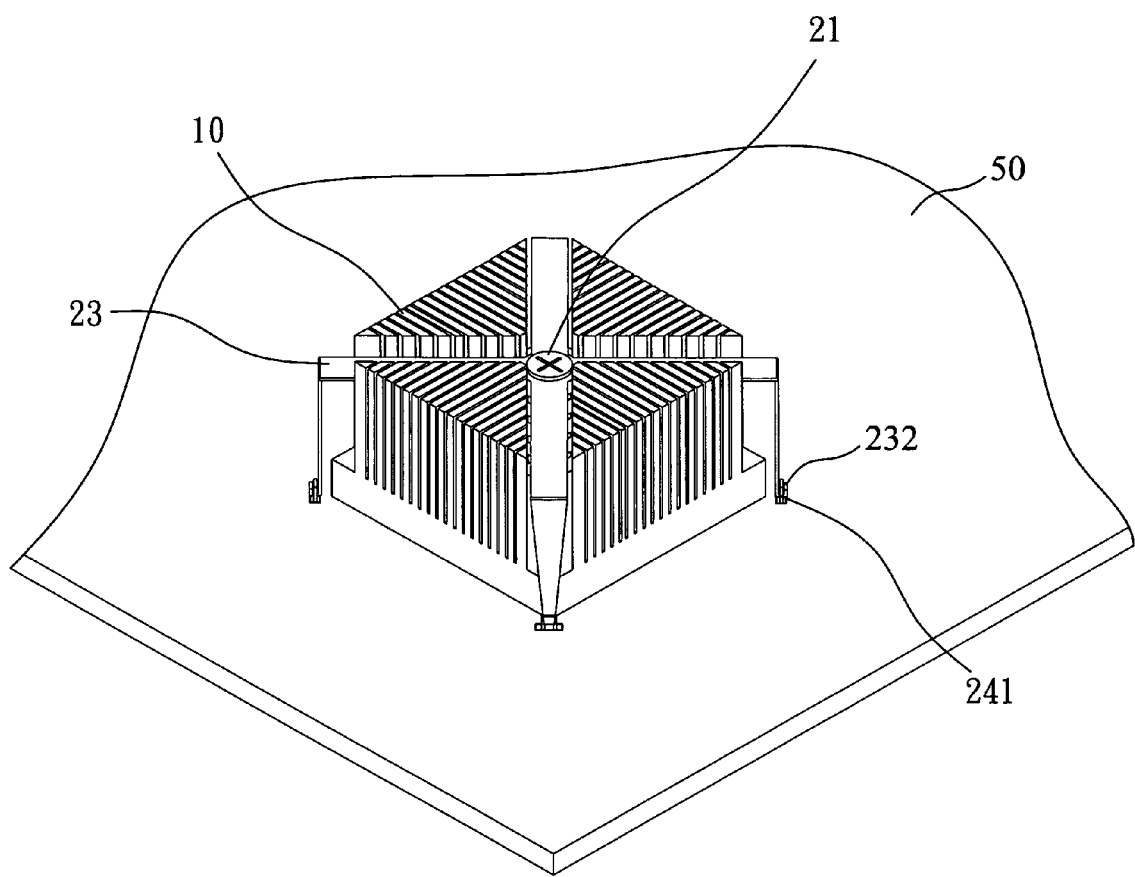
FIG. 2 is an illustrative diagram showing the heat sink of this invention.
Figure 3:
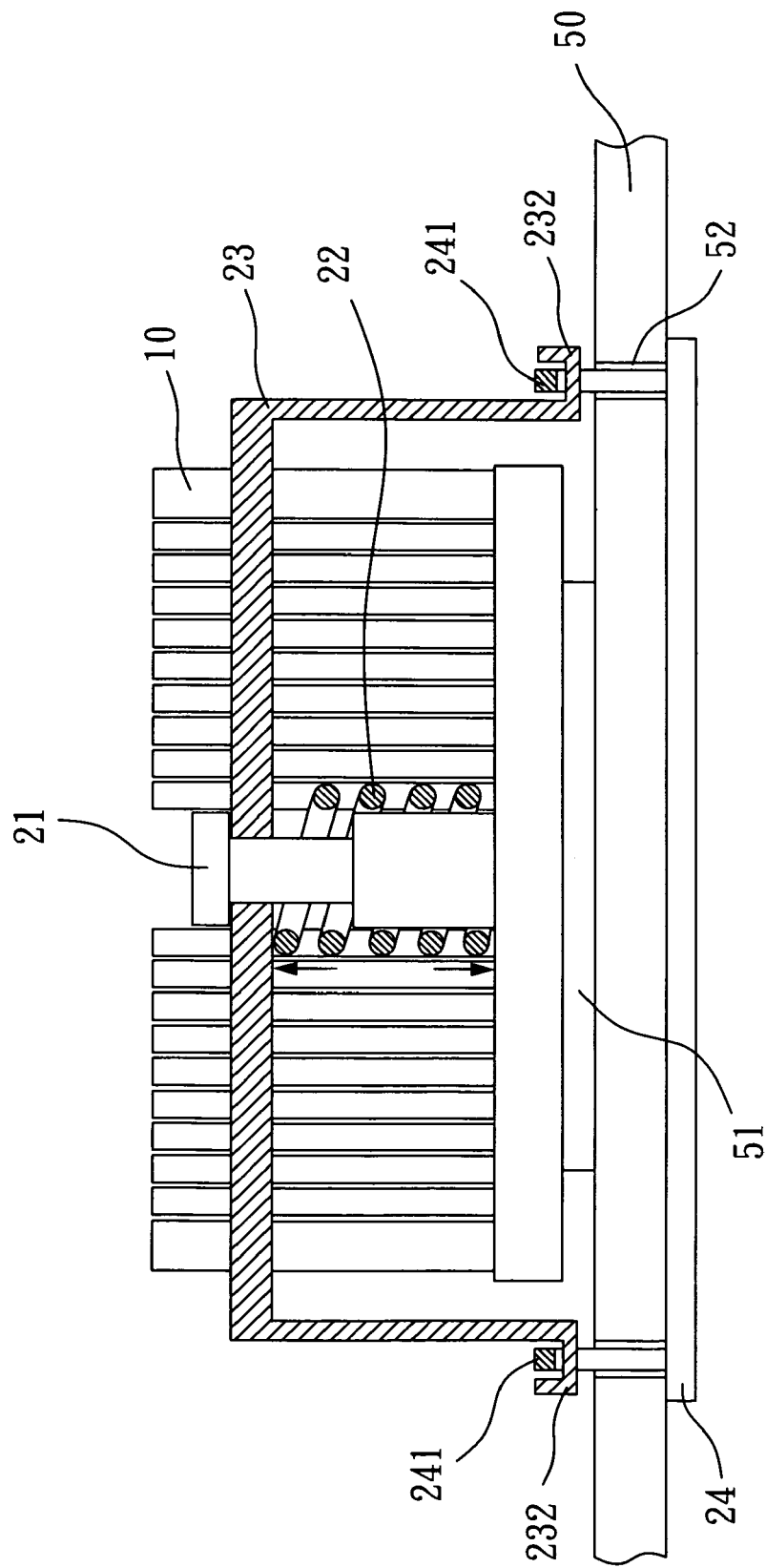
FIG. 3 is a cross-sectional view of the heat sink of this invention.

Refer to FIGS. 2 and 3 for an illustrative diagram and a cross-sectional view of the heat sink of this invention, respectively. As shown, during the installation of the heat sink 1 of this invention, the user may use the adjustable positioning member 21 to combine the hooking member 23, the elastic member 22, and the fin structure 10; after that, the heat sink 1 is disposed on the electronic component 51. Then the adjustable positioning member 21 is tightened, and the hooking member 23 is pressed down to compress the elastic member 22; the hooking structures 232 of the hooking member 23 are then engaged with the corresponding hooking and fixing bases 241. After confirming that the hooking structures 232 are fitted to the corresponding hooking and fixing bases 241, the user releases the pressure imposed on the hooking member 23; meanwhile, since the two ends of the elastic member 22 are propping against the hooking member 23 and the fin structure 10 respectively, the resilience force of the elastic member 22 will downwardly apply pressure on the fin structure 10 so as to tightly adhere the fin structure 10 on the electronic component 51 and upwardly push the hooking member 23, thus making the hooking structures 232 hook to the hooking and fixing bases 241, stably securing the heat sink 1 on the electronic component 51.

Accordingly, by adjusting the adjustable positioning member 21 to adjust the compression of the elastic member 22, the user may easily adjust the pressure imposed on the electronic component 51 by the fin structure 10; in other words, the pressure may be predefined so as to cause the heat sink 1 to be tightly adhered on the electronic component 51 after the installation of the heat sink 1. In this embodiment, the elastic member 22 is a spring, but this invention is not limited thereto; other resilient structures may also be used. When the user wants to dismount the heat sink 1, he or she may simply loosen the adjustable positioning member 21 and press down the hooking member 23 to release the hooking structures 232 from the hooking and fixing bases 241; then the heat sink 1 may be easily withdrawn to complete the disassembly. Thus, no tools are required during the uninstallation. With the use of a positioning member and a hooking member 23, the user may easily complete the installation of the heat sink 1, and the time needed for this installation may be greatly reduced.

Figure 4:
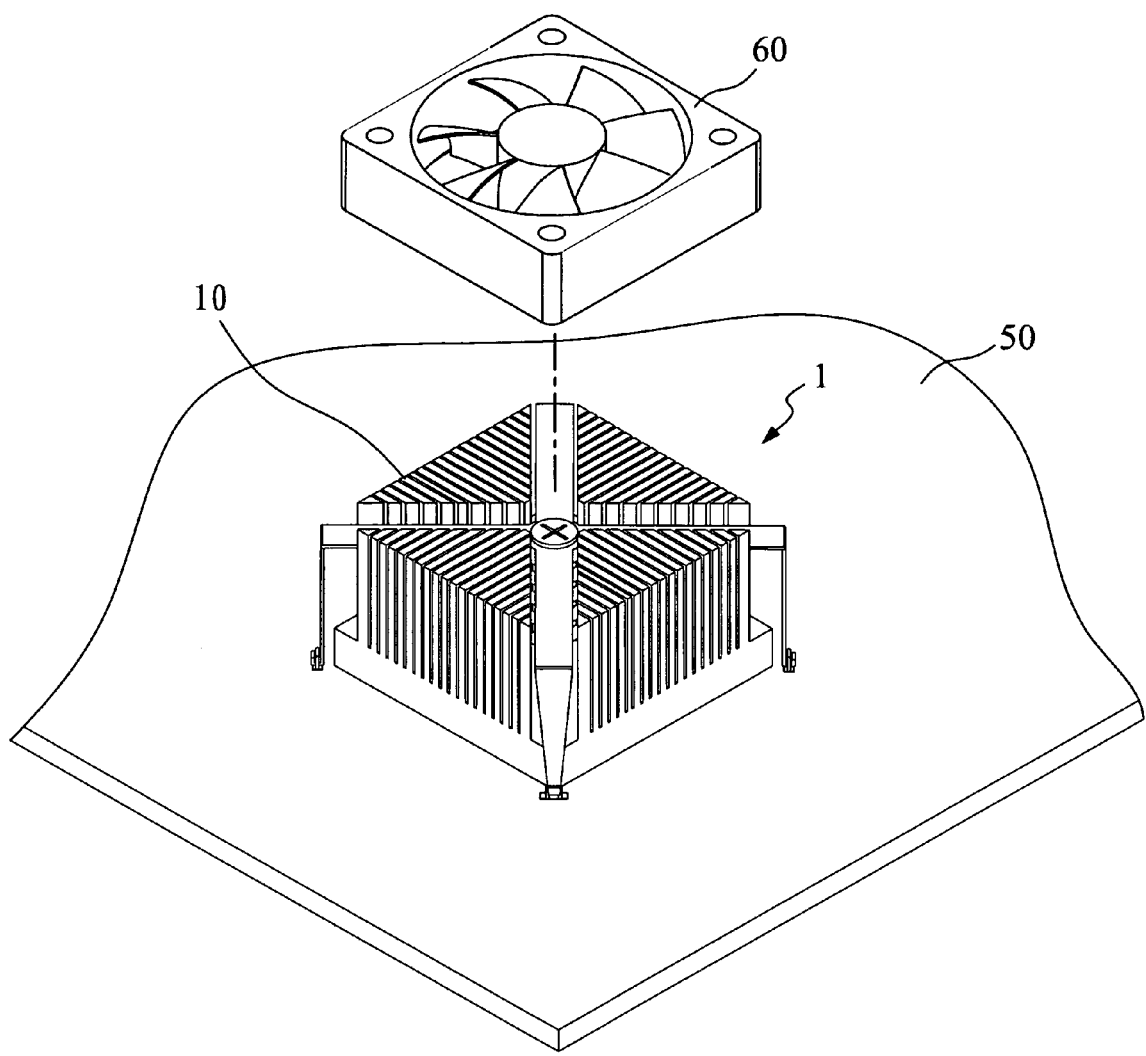
FIG. 4 is an illustrative diagram showing another embodiment of the heat sink of this invention.

Refer to FIG. 4 for an illustrative diagram showing another embodiment of the heat sink of this invention. In this embodiment, the heat sink 1 further comprises a fan 60 to increase the efficiency of heat dissipation. The fan 60 is connected to the fin structure 10 and is capable of blowing air through the fin structure 10 to dissipate heat conducted away from the electronic component (not shown), greatly increasing the capability of the heat sink 1. It should be noted that the fan 60, without any limitation, may also be replaced by other cooling components, such as a water-cooling heat dissipating device.

Figure 5:
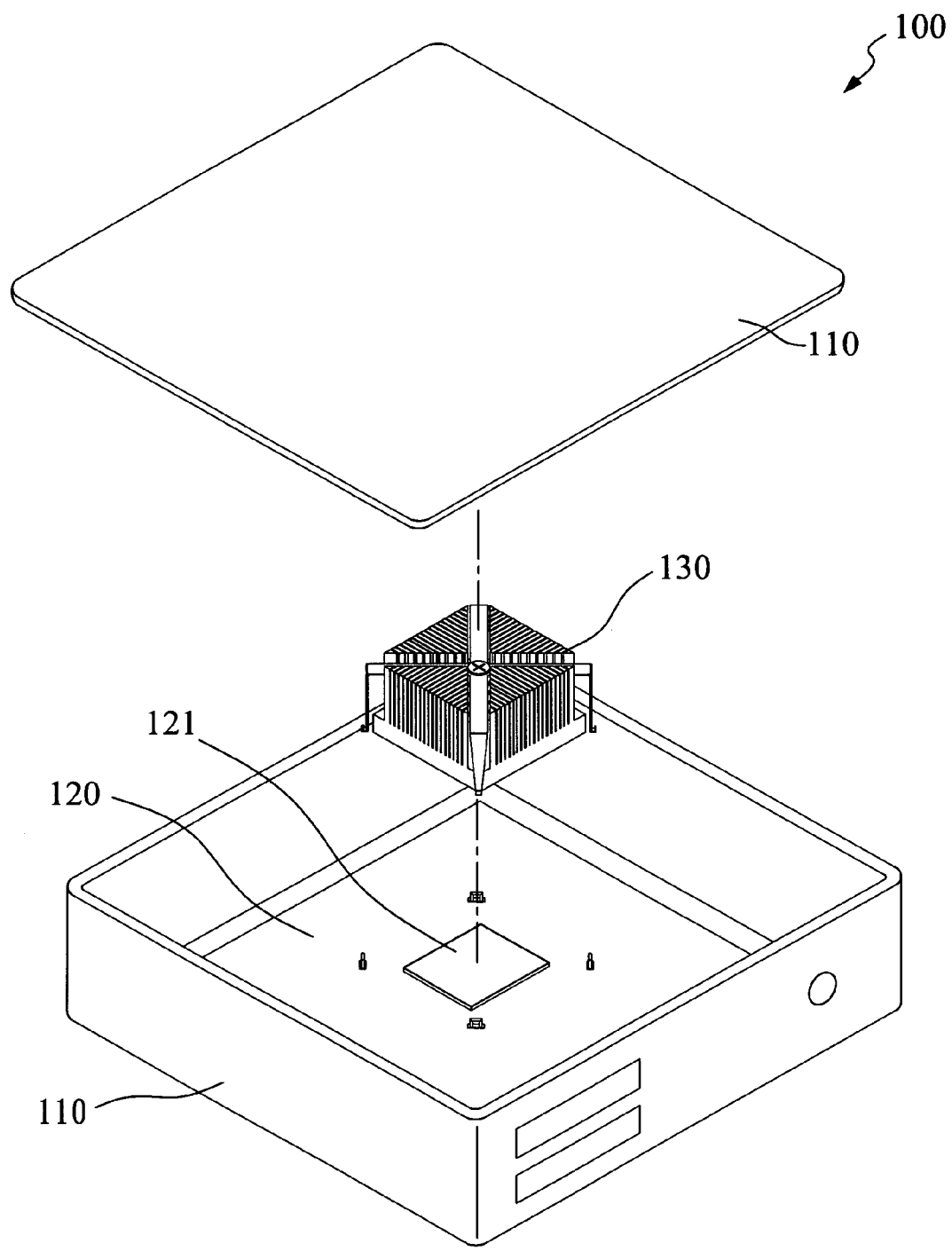
FIG. 5 is an explosive view of the electronic apparatus with a heat sink of this invention.

Refer to FIG. 5 for an explosive view of the electronic apparatus with a heat sink of this invention. As shown, the electronic apparatus with a heat sink 100 comprises a housing 110, a circuit board 120, and at least one heat sink 130 as mentioned above. The circuit board 120 is disposed in the housing 110 and comprises at least one electronic component 121. The heat sink 130 is correspondingly disposed on the electronic component 121 for heat dissipation. Accordingly, the electronic apparatus with a heat sink 100 of this invention includes the heat sink 130, which can be easily mounted on the electronic component 121 that needs to be cooled. The aforementioned design may keep the electronic component 121 from being damaged and also reduce the installation time. In this embodiment, the electronic apparatus with a heat sink 100 may be without limitation a desktop computer or a notebook computer or other electronic products that need to be cooled.

Although the present invention has been explained in relation to its preferred embodiments, it is to be understood that many other possible modifications and variations can be made without departing from the spirit and scope of the invention as hereinafter claimed.

What is claimed is:

1. A heat sink applicable to an electronic apparatus comprising a circuit board having an electronic component, the heat sink comprising:
   a fin structure; and
   a fastening assembly comprising an adjustable positioning member, an elastic member, and a hooking member, the elastic member being disposed between the hooking member and the fin structure such that the adjustable positioning member couples the hooking member, the elastic member, and the fin structure;
   wherein the hooking member secures the heat sink on the electronic component, and the adjustable positioning member adjusts a tightness of the securement between the heat sink and the electronic component.

2. The heat sink of claim 1, wherein the fastening assembly further comprises a fixing and supporting module mountable to the circuit board, the fixing and supporting module comprising a plurality of hooking and fixing bases.

3. The heat sink of claim 2, wherein the hooking member comprises a plurality of hook structures corresponding to the plurality of hooking and fixing bases.

4. The heat sink of claim 1, wherein the hooking member is a cross-shaped hook.

5. The heat sink of claim 1, wherein the fin structure is disposed with a groove for accommodating the hooking member.

6. The heat sink of claim 1, further comprising a fan connected to the fin structure for facilitating heat dissipation.

7. The heat sink of claim 1, wherein the adjustable positioning member is a captive screw.

8. The heat sink of claim 1, wherein the elastic member comprises two ends, and the two ends of the elastic member are respectively urged against the hooking member and the fin structure.

9. An electronic apparatus comprising:
   a housing;
   a circuit board disposed in the housing, the circuit board comprising at least one electronic component; and at least one heat sink mounted on the at least one electronic component, each heat sink comprising:

a fin structure; and a fastening assembly comprising an adjustable positioning member, an elastic member, and a hooking member, the elastic member being disposed between the hooking member and the fin structure such that the adjustable positioning member couples the hooking member, the elastic member, and the fin structure;

wherein the hooking member secures the heat sink on the electronic component and the adjustable positioning member adjusts a tightness of the securement between the heat sink and the electronic component.

10. The heat sink of claim 9, wherein the fastening assembly further comprises a fixing and supporting module mountable to the circuit board, the fixing and supporting module comprising a plurality of hooking and fixing bases.

11. The heat sink of claim 10, wherein the hooking member comprises a plurality of hook structures corresponding to the plurality of hooking and fixing bases.

12. The heat sink of claim 9, wherein the hooking member is a cross-shaped hook.

13. The heat sink of claim 9, wherein the fin structure is disposed with a groove for accommodating the hooking member.

14. The heat sink of claim 9, further comprising a fan connected to the fin structure for facilitating heat dissipation.

15. The heat sink of claim 9, wherein the adjustable positioning member is a captive screw.

16. The heat sink of claim 9, wherein the elastic member comprises two ends, and the two ends of the elastic member are respectively urged against the hooking member and the fin structure.

* * * * *

UNITED STATES PATENT AND TRADEMARK OFFICE
CERTIFICATE OF CORRECTION

| | | |
|---|---|---|
| PATENT NO. | : 7,679,919 B2 | Page 1 of 1 |
| APPLICATION NO. | : 12/216017 | |
| DATED | : March 16, 2010 | |
| INVENTOR(S) | : Chia-Ming Lee | |

It is certified that error appears in the above-identified patent and that said Letters Patent is hereby corrected as shown below:

Column 5, Line 14 (claim 10): Please replace "heat sink" with --electronic apparatus--.

Column 6, Line 1 (claim 11): Please replace "heat sink" with --electronic apparatus--.

Column 6, Line 4 (claim 12): Please replace "heat sink" with --electronic apparatus--.

Column 6, Line 6 (claim 13): Please replace "heat sink" with --electronic apparatus--.

Column 6, Line 9 (claim 14): Please replace "heat sink" with --electronic apparatus--.

Column 6, Line 11 (claim 15): Please replace "heat sink" with --electronic apparatus--.

Column 6, Line 13 (claim 16): Please replace "heat sink" with --electronic apparatus--.

Signed and Sealed this
Twenty-ninth Day of January, 2013

David J. Kappos
*Director of the United States Patent and Trademark Office*